United States Patent
Haba et al.

(10) Patent No.: US 7,262,368 B2
(45) Date of Patent: Aug. 28, 2007

(54) CONNECTION STRUCTURES FOR MICROELECTRONIC DEVICES AND METHODS FOR FORMING SUCH STRUCTURES

(75) Inventors: Belgacem Haba, Cupertino, CA (US); Masud Beroz, Livermore, CA (US); David B. Tuckerman, Orinda, CA (US); Giles Humpston, San Jose, CA (US); Richard Dewitt Crisp, Castro Valley, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/917,978

(22) Filed: Aug. 13, 2004

(65) Prior Publication Data

US 2006/0032670 A1    Feb. 16, 2006

(51) Int. Cl.
*H01R 12/04* (2006.01)
*H05K 1/11* (2006.01)

(52) U.S. Cl. ............... 174/262; 174/265; 174/266; 174/267

(58) Field of Classification Search ........ 174/262–266; 29/842–853
See application file for complete search history.

(56) References Cited

U.S. PATENT DOCUMENTS

| | | | |
|---|---|---|---|
| 4,655,516 A * | 4/1987 | Shaffer et al. ............. | 439/67 |
| 5,071,359 A | 12/1991 | Arnio et al. | |
| 5,092,036 A * | 3/1992 | Hu et al. ............. | 29/854 |
| 5,531,021 A * | 7/1996 | Kolman et al. ............. | 29/843 |
| 6,177,636 B1 | 1/2001 | Fjelstad | |
| 6,372,620 B1 | 4/2002 | Oosawa | |
| 6,448,510 B1 | 9/2002 | Neftin et al. | |
| 6,528,874 B1 | 3/2003 | Iijimal | |
| 6,617,236 B2 | 9/2003 | Oosawa | |
| 6,646,337 B2 | 11/2003 | Iijima | |
| 6,747,216 B2 * | 6/2004 | Brist et al. ............. | 174/262 |

FOREIGN PATENT DOCUMENTS

EP    0 593 966 A    4/1994

* cited by examiner

*Primary Examiner*—Tuan Dinh
(74) *Attorney, Agent, or Firm*—Lerner, David, Littenberg, Krumholz & Mentlik, LLP (57) ABSTRACT

Provided are connection structures for a microelectronic device and methods for forming the structure. A substrate is included having opposing surfaces and a plurality of holes extending through the surfaces. Also included is a plurality of electrically conductive posts. Each post extends from a base to a tip located within a corresponding hole of the substrate. An additional substrate may be provided such that the base of each post is located on a surface thereof. Additional electrically conductive posts may be provided having tips in corresponding holes of the additional substrate. Optionally, a dielectric material may be placed between the substrate and the posts.

51 Claims, 6 Drawing Sheets

CONNECTION STRUCTURES FOR MICROELECTRONIC DEVICES AND METHODS FOR FORMING SUCH STRUCTURES

FIELD OF THE INVENTION

The present invention relates generally to connection structures for microelectronic devices. In particular, the invention relates to connection structures having electrically conductive posts whose tips lie in corresponding holes of one or more substrates. Also provided are methods for forming connection structures.

BACKGROUND OF THE INVENTION

As electronics products become more complex, demands placed upon microelectronic device packaging increase. For example, mobile electronics products such as cellular phones continue to decrease in size and cost while providing higher levels of functionality. As a result, microelectronic devices such as semiconductor chips for electronic products often require numerous input and output connections to other electronic components. To meet these demands, microelectronic devices are increasingly packaged in chip-scale and multi-chip packages to facilitate device testing and connection to other electronic components of the electronic products.

Terminals for microelectronic devices are typically disposed in regular grid-like patterns, substantially covering the bottom surface of the device (commonly referred to as an "area array") or in elongated rows extending parallel to and adjacent each edge of the device's front surface. Accordingly, packages for such a microelectronic devices may employ a connection structure having prefabricated arrays or rows of leads/discrete wires, solder bumps or combinations of both for connection with the device. Techniques for making the interconnections between the microelectronic device and the package include, for example, wire bonding, tape automated bonding ("TAB") and flip/chip bonding.

The flip-chip bonding configuration yields a particularly compact assembly. In this configuration, the front or contact-bearing surface of the microelectronic device faces towards a connection structure. Each contact on the device is joined by a solder bond to a corresponding contact pad on the connection structure, by positioning solder balls on the connection structure or device, juxtaposing the device with the connection structure in the front-face-down orientation, and momentarily reflowing the solder. As a result, the assembly occupies an area of the connection structure no larger than the area of the chip itself.

As the number of interconnections per microelectronic device increases and the size of microelectronic devices decrease, the number of contacts per unit area of the front surface also increases. Accordingly, the contact pitch for the device becomes finer. Since many packaging configurations require a contact pitch that corresponds to the pitch of the device contacts, there is a need for connection structures having an increasingly finer contact pitch or greater contact density. In particular, such connection structures are well suited for the flip-chip bonding configurations.

A number of approaches have been proposed for the production of packaging having contacts of a fine pitch. Such approaches may involve the production of a plurality of posts extending from a surface of a substrate. For example, metallic posts may be produced on a metallic substrate surface through the use of stamping techniques known in the art.

Chemical techniques may be used as well. For example, U.S. Pat. No. 6,177,636 to Fjelstad describes a connection component that includes a substrate and a plurality of substantially rigid, elongated posts protruding parallel to one another from a substrate surface. The connection component may be formed by attaching a substrate to a conductive sheet and is then selectively removing portions of the conductive sheet, e.g., using an etching process, to produce a plurality of posts each extending from a base at the substrate to a tip. The tips may have coplanar surfaces. Once the tips are electrically connected to contacts of a microelectronic device, the posts become individual interconnections between the microelectronic device and the substrate.

Similarly, U.S. Pat. Nos. 6,528,874 and 6,646,337, each to Iijima et al., also describe methods for substrates for mounting electronic devices, such as integrated circuits (ICs) and large-scale integrated circuits (LSI circuits). The wiring substrates are formed by selectively etching a copper foil laminate so as to form layers having posts of uniform height. The layers may be stacked to form wiring circuit layers. Improved reliability of electrical connections is attributed to the uniformity in post height.

In addition, electrolytic plating methods for forming posts on a metal substrate are described in U.S. Pat. Nos. 6,372,620 and 6,617,236, each to Oosawa et al. These methods are similar to the methods described in U.S. Pat. Nos. 6,528,874 and 6,646,337 in that they each employ masking technologies to control the locations of post formation. Unlike etching processes in which exposed portions of a conductive layer on a substrate are removed, posts are formed by depositing metal on the exposed portions of the substrate.

Nevertheless, there exists further opportunities in the art to provide connection structures having increasingly finer contact pitch and/or greater contact density.

SUMMARY OF THE INVENTION

The invention provides a connection structure for a microelectronic device. The structure typically includes first and second substrates and electrically conductive first and second posts. Each substrate has a first surface, a second surface opposing the first surface, and a plurality of holes extending through the first and second surfaces. The substrates are arranged such that the first surfaces face each other. Each first post extends from a base at the first surface of the first substrate toward a tip in a corresponding hole of the second substrate. Similarly, each second post extends from a base at the first surface of the second substrate toward a tip in a corresponding hole of the first substrate.

Optionally, the connection structure includes a dielectric material between the first substrate and at least one of the second posts. However, the second substrate may be absent. Alternatively, the second substrate is present but the holes of the second substrate and the first posts are absent.

Methods for forming the connection structures are provided as well. First and second layers are provided and may be laminated to each other. With an appropriate arrangement of posts and substrates in the layers, the layers may be positioned such that at least one of the above-described structures is formed. Additive, subtractive, and/or mechanical processes are typically employed to form posts and/or holes.

BRIEF DESCRIPTION OF THE DRAWINGS

FIGS. 1A and 1B illustrate the connection structure in top and bottom views, respectively. FIG. 1C depicts the connection structure in cross-sectional view along the plane indicated by dotted line P.

DETAILED DESCRIPTION OF THE PREFERRED EMBODIMENTS

Before describing the present invention in detail, it is to be understood that the invention is not limited to specific microelectronic devices or types of electronic products, as such may vary. It is also to be understood that the terminology used herein is for the purpose of describing particular embodiments only, and is not intended to be limiting.

As used in this specification and the appended claims, the singular article forms "a," "an," and "the" include both singular and plural referents unless the context clearly dictates otherwise. Thus, for example, reference to "a post" includes a plurality of posts as well as a single post, reference to "a hole" includes a collection of holes as well as single hole, reference to "a material" includes a single material as well as a combination of materials, and the like.

Thus, the invention generally relates to a connection structure for a microelectronic device and methods for forming the structure. The structure includes a substrate having opposing surfaces and a plurality of holes extending through the surfaces. Also included is a plurality of electrically conductive posts. Each post extends from a base to a tip located within a corresponding hole of the substrate. An additional substrate may be provided such that the base of each post is located on a surface thereof. When present, the additional substrate may also have opposing surfaces and a plurality of holes extending therethrough. Substrates are typically arranged in a stack. Additional electrically conductive posts may also be provided, wherein the additional posts have tips in corresponding holes of the additional substrate. Optionally, a dielectric material is provided between the substrate and the posts.

Figure 1A:
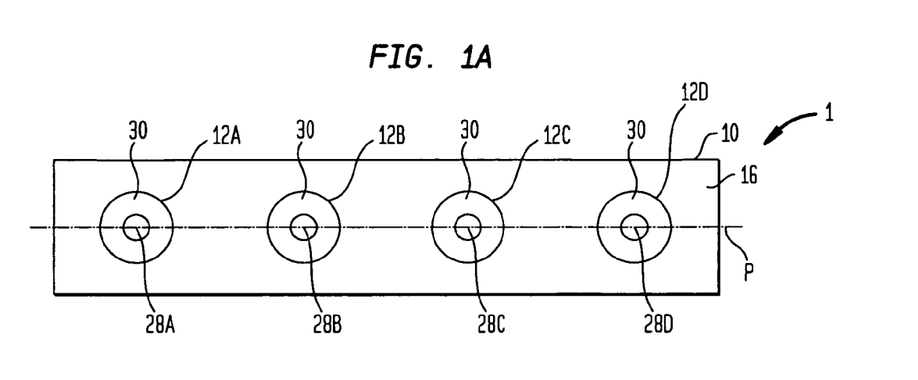
FIGS. 1A-1C, collectively referred to as FIG. 1, depict an exemplary connection structure of the invention.
Figure 1B:
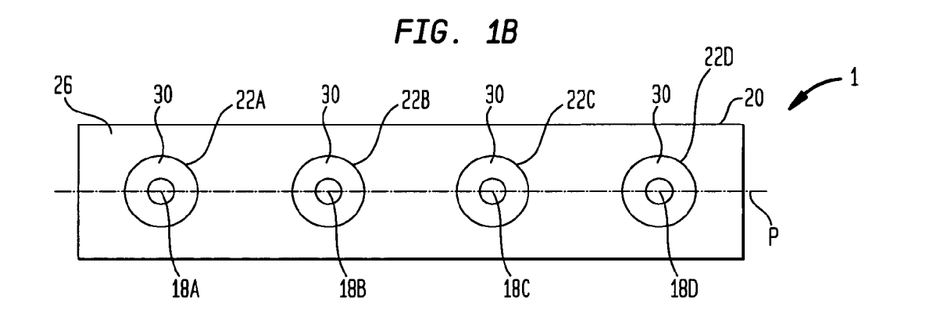
Figure 1C:
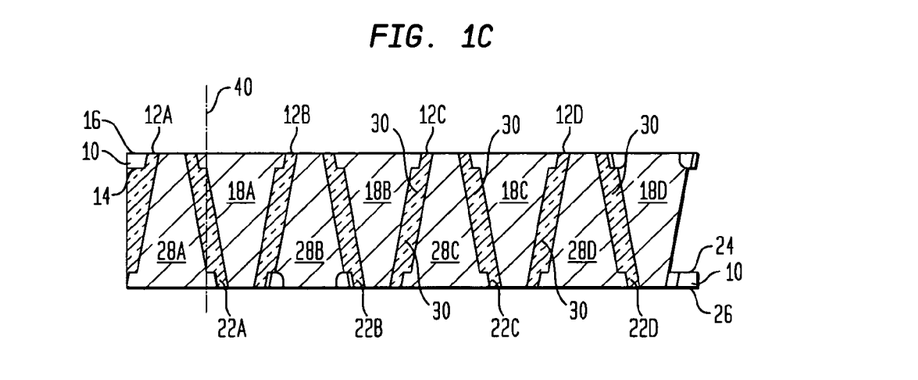

FIG. 1 depicts in an exemplary connection structure of the invention in the form of a multilayer laminate having two major exterior surfaces and containing a plurality of closely-spaced posts therethrough that provides electrical paths between the major surfaces. As with all figures referenced herein, in which like parts are referenced by like numerals, FIG. 1 is not to scale, and certain dimensions may be exaggerated for clarity of presentation. In the connection structure 1, two substrates 10, 20 are provided. The first substrate 10 contains a plurality of holes 12A-12D extending through parallel opposing surfaces 14, 16. Similarly, the second substrate 20 contains a plurality of holes 22A-22D extending through parallel opposing surfaces 24, 26. The second substrate is arranged over the first substrate such that surfaces 14 and 16 face each and are located in the interior of the connection structure 11. As depicted, interior surfaces 14 and 24 are parallel to each other. Accordingly, major exterior surfaces 16 and 26 are parallel to each other as well.

The connection structure 1 also includes a plurality of posts 18A-18D, 28A-28D, all having the same truncated conical shape. The posts also have the same size. First conductive posts 18A-18D are arranged such that they each extend from a base at surface 14 toward a tip in a corresponding hole 22A-22D of the second substrate 20. Similarly, second conductive posts 28A-28D are arranged such that they each extend from a base at surface 24 toward a tip in a corresponding hole 12A-12D of the first substrate 10. Posts 18A-18D and posts 28A-28D are electrical connected to substrate 10 and substrate 20, respectively.

The connection structure 1 exhibit of notable geometries. As an initial matter, posts 18A-18D and posts 28A-28D generally extend along axes which are parallel to each other and perpendicular to surfaces 14 and 24. In addition, neighboring posts 18A, 28A are generally arranged in close proximity to one another. The close proximity is facilitated in part by the shape of the posts. Notably, neighboring posts 18A, 28A have substantially parallel walls or "side" surfaces that are not perpendicular to the second surfaces of the substrates. In addition, neighboring posts 18A, 28A are shaped and arranged so as to allow for a portion of each and the regions of the substrates associated therewith to be intersected by a line 40 that is substantially perpendicular to at least one of surfaces 16, 26. In the alternative, regions of substrates associated with two neighboring posts may lie along the same perpendicular line without the line intersecting both posts.

A dielectric material 30 is depicted between substrates 10, 20. The dielectric material serves to insulate the first and second substrate 10, 20 from each other. The dielectric material also serves to insulate the first posts 18A-18D from the second substrate 20 and from the second posts 28A-28D.

Thus, it should be apparent the structure depicted in FIG. 1 may function in a number of different roles in a microelectronic device packaging context. Because the structure provides a plurality of closely-spaced electrical paths, the structure may serve, for example, as a fine pitched and/or high-contact-count wiring board, a thermal spreader, and/or an interposer between semiconductor chips and/or other electronic components of an electronic product. In addition, posts 18A-18C may be electrically connected to ground, posts 28A, 28C, 28D may be connected to a power source, and posts 18D and 28B are isolated signal posts. Thus, any one or a combination of ground, power and signal posts may be accessed from either major surface of the connection structure. Enhanced electrical, e.g., performance due to reduced inductance is often associated with coplanar ground, power and/or signal posts.

Turning to the components of the invention, substrates for use in the invention are typically comprised of an electrically conductive material. For example, a substrate may be formed from a metal foil. Suitable foil materials include, for example, copper, aluminum, tin, gold, silver, nickel, iron, chromium, zinc, titanium, combinations thereof, and alloys of any of the forgoing such as brass, bronze, and steel. However, the substrate may additionally include dielectric materials as well. For example, the substrate may be formed from a layer of electrically conductive material, e.g., a metal such as aluminum, on a layer of dielectric material, e.g., ceramic film such as aluminum oxide such or a polymeric film such as polyimide or polyester. In any case, when more than one substrate is employed to form the inventive connection structure, the substrates may be comprised of the same or different materials.

Depending on the material used and the handling requirements for the substrate, the substrate may be flexible, semi-flexible or substantially rigid. Typically, the substrate is substantially inextensible, though a substrate with some extensibility may be employed as well. In addition, substrate thickness may vary. The thickness requirements for the substrate generally depends on the strength of the material as well as the stresses imposed on the substrate. Typically, bare metal foils having a thickness of about 5 µm to about 500 µm may be used for reel-to reel web processes. Often, foil thicknesses lie in the range of about 10 µm to about 100 µm. More often, foil thicknesses lie in the range of about 15 µm to about 50 µm for materials having a relatively higher strength such as steel; however, the minimum thickness required for a foil is typically lower than for a material with a generally lower strength such as copper and aluminum. Thus, for example, the minimum thickness required for freestanding steel foils for a particular process may be on the order of about 5 µm to about 15 µm, whereas the minimum thickness required for freestanding copper foils for the same process may be on the order of 10 µm to about 40 µm.

In addition, substrates for use in the invention typically have at least one substantially planar surface that may be contiguous or discontiguous. When a plurality of substrates is employed, the substrates may be positioned to arrange surfaces thereof parallel to one another. However, nonparallel substrate surfaces may be advantageously used as well. In addition, at least a portion of a substrate, if not the entire substrate, may be electrically isolated from a portion or the entirety of another substrate.

The posts are comprised of an electrically conductive material. Typically, the posts are made from one or more metals. For example, a post on a substrate may be comprised of a solid copper member or a composite composition containing copper particles in a matrix solder material. The metals suitable for use for metal foil substrates may be advantageously used to form the posts as well. A post extending from a surface of a metal substrate may be comprised of the same or different metal used for the substrate. In addition or in the alternative, a nonmetallic conductive material may be used to form the posts. Exemplary nonmetallic conductive materials include carbon, e.g., graphite or acetylene black, conductive ceramics such as indium tin oxide and titanium nitride, and conductive polymers such as polypyrrole. While hollow or porous posts may be used in some instances, the posts are typically solid or substantially solid so as to increase their electrical conductance or current-carrying capacity. In some instances, the inventive structure may contain posts that are electrically connected to each other, e.g., through a substrate. Posts may be electrically isolated from one another as well.

A post may have a surface layer of a composition different from its core. For example, the surface layer may be comprised of a highly conductive coating such as gold, gold/nickel, gold/osmium or gold/palladium, or plated with a wear resistant, coating such as osmium, chromium or titanium nitride.

The posts of the invention may be formed in any number of shapes. As shown in FIG. 1, posts extending from the same substrate surface may have the same shape and/or size. However posts of different sizes and shapes may be used as well.

In some instances, the inventive structure may include a post that has a tapered profile such that the tip thereof has a smaller cross-sectional area than the base thereof. Exemplary shapes having a tapered profile include tetrahedrons and pyramids. In such a case, finer pitches can generally be achieved when post surfaces are perpendicular or nearly perpendicular to the substrate surface on which the base of the post is located.

Thus, fine pitch can generally be achieved when post surfaces extend from their associated substrate surfaces at an angle of about 45° to 90°. Finer pitches may be associated with post/substrate angles of about 60° to 90°. Nevertheless, post/substrate angles less than 45° may be advantageously used as well in conjunction with the invention.

In addition or in the alternative, a post may have a narrow region between tip and base thereof. The narrow region may have a smaller cross-sectional area than either the tip or the base. For example, cooling tower shaped posts may be used. Hourglass-shaped posts may be used as well.

Furthermore, an axially symmetric post may be used. Exemplary axially symmetric shapes include cones, truncated or otherwise, cylinders, hemispheres and spheres. A post may be either elongate or squat along the axis extending from it base to its tip, but the post will typically have a height of about 25 µm to about 500 µm along its axis.

Each post may have a substantially planar surface at the tip thereof. A plurality of tips may have surfaces that are substantially coplanar to each other. Optionally, the tip of a post in a hole of a substrate has a surface that is substantially coplanar to the major surface of the substrate distal to the base of the post. In such a case, an additional substrate and an additional post having a tip surface may be employed such that tip surface of the additional post is substantially coplanar to a major surface of the additional substrate. In other instances, the surface of the tip may extend beyond an exterior surface of a substrate. Typically, the tip of at least one post is centered or at least substantially centered in a corresponding substrate hole. This can be accomplished using an undersized corresponding hole with a selected post, an oversized post with a corresponding hole, or through alignment means known in the art, e.g., mating features, optical guides, devices used in metrology, etc.

It should be noted that the phrase "substantially coplanar" as used to describe the term "surfaces," refers to surfaces that are at least to a considerable extent or degree coplanar. For example, substantially coplanar surfaces may have sections that lie near, but not in the same plane. The term "substantially" is used analogously in other contexts involve an analogous definition.

The posts may be arranged so that they are present in a high density per unit area. For example, the posts may be present in a density greater than about 100 posts per square centimeter. In some instances, a density of greater than about 400 posts per square centimeters can be achieved. In addition, while the posts can be arranged in any pattern, at least some posts extending from a substrate surface may be arranged in an array. The term "array" generally refers to an ordered two-dimensional arrangement of features, such as posts on a substrate surface. Exemplary arrays types include rectilinear grids, parallel stripes, spirals, and the like.

Figure 2A:
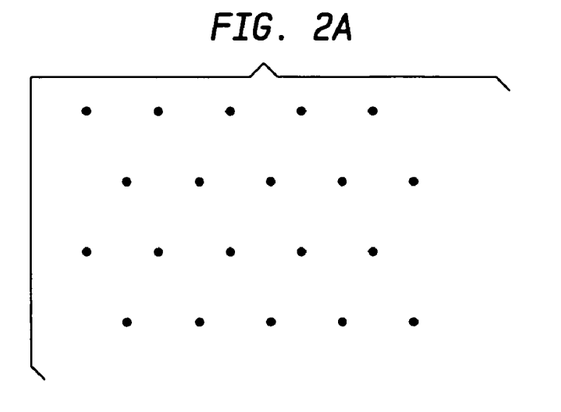
FIGS. 2A-2C, collectively referred to as FIG. 2, depict exemplary arrays of features.
Figure 2B:
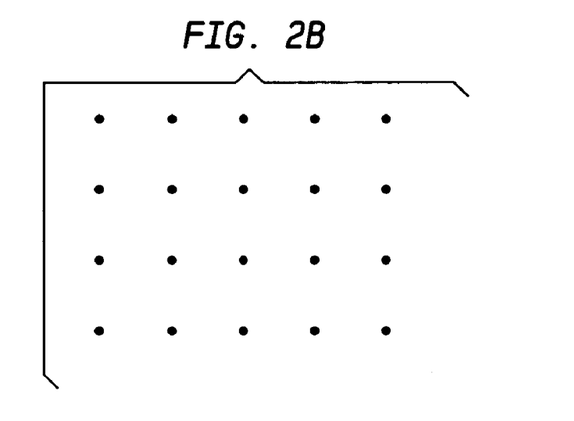
Figure 2C:
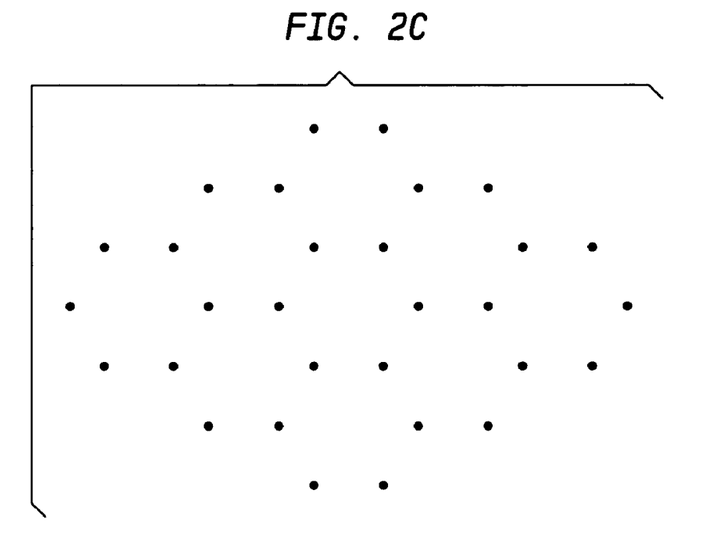

Depending on the type of array employed, a post may have varying numbers of flanking posts. FIG. 2 depicts exemplary post array formations of the invention. As depicted in FIG. 2A, each feature of an equilateral triangular array has six equidistant flanking features. In a square grid array, as depicted in FIG. 2B each feature has four equidistant flanking features. In an equilateral hexagonal array, as depicted in FIG. 2C, each feature has three equidistant flanking features.

Optionally, the inventive structure may include a plurality of arrays. The arrays may be the same or different. For example, the arrays may have the same number of different numbers of posts per unit area. In addition, the posts of each array may be identical or different in size and/or shape.

The inventive structure may also include a dielectric material disposed between a plurality of posts, a plurality of substrates, and/or a post and a substrate. The dielectric material may serve one or more functions. For example, the material may be placed or dispensed between substrates to provide adhesion and/or electrical isolation therebetween. In addition, the material may serve to maintain the alignment between neighboring posts. Furthermore, the material may be provided to maintain the spatial and/or orientational relationship between a post and a corresponding substrate hole. Other functions that the dielectric material may serve will be apparent to those of ordinary skill in the art.

Accordingly, the dielectric material may be selected according to its functionality. For example, when high rigidity, hardness, and/or high temperature dimensional stability is required, the dielectric material may be comprised of a ceramic material. Exemplary ceramic materials include single or mixed metal oxides, nitrides, and carbides. Ceramic materials also provide excellent coupling between the substrates, which is advantageous when the substrates serve as power and ground planes. However, when compliancy or relative softness is desired, polymeric materials may be used as the dielectric material. Exemplary polymeric materials include, but are not limited to polyethylene, polypropylene, polybutylene, polyesters such as polyethylene terephthalate, halogenated polymers such as partially and fully fluorinated alkanes and partially and fully chlorinated alkanes, polyethers, polyimides, and polysiloxanes. Factors affecting the selection of polymeric materials include, for example, molecular weight, crystallinity, glass transition and/or melting temperature, modulus of elasticity, creep, and degree of branching and/or crosslinking. In some instances, the dielectric material may be formed from a combination of polymeric and ceramic materials.

The invention also provides for a method for forming a connection structure for a microelectronic device, such as the connection device described above. In general, a first layer is provided comprising a substrate having a first surface, a second surface opposing the first surface, and a plurality of holes extending through the first and second surfaces. A second layer is also provided comprising a plurality of posts. Each post is electrically conductive and extends from a base toward a tip. The layers are arranged such that each tip of the posts is located in a corresponding hole of the substrate.

In some instances, the first layer also includes a plurality of electrically conductive posts. Each post of the first layer may extend from a base at the first substrate surface toward a tip. In addition or in the alternative, the second layer may also include a substrate having first and second surfaces. Optionally, holes may be present in the substrate of the second layer. In any case, each layer includes a substrate, and the layers are typically arranged relative to each other such that the first surfaces face each other.

The posts may be formed using any of a number of techniques or combinations thereof. For instance, posts for at least one layer by may be formed using a subtractive process. In some embodiments, an electrically conductive sheet is provided on a substrate surface, and material is selectively removed, e.g., via chemical, electrochemical, or plasma etching, from the sheet to form a plurality of posts extending from the substrate surface. Alternatively, material is removed from a unitary sheet of electrically conductive material to form posts as an integral part of the substrate for the at least one layer. Additional information regarding the use of a subtractive process to form posts can be found, for example, in U.S. Pat. No. 6,177,636 to Fjelstad.

Similarly, holes in substrates may be formed using subtractive processes as well. For example, an etchant may be selectively applied to a substrate to etch holes therethrough. In some instances, the same etchant may be used to form both the holes and the posts associated with a substrate. In some instances, subtractive processes may also be used to isolate a selected post of attached to a substrate electrically from the other posts attached to the same post, e.g., by selectively etching away portions of the substrate to separate the substrate into discontiguous sections.

Posts may also be formed by an additive process. For example, conductive material may be selectively deposited on a substrate surface to form posts thereon. Exemplary material deposition techniques include electroplating, chemical vapor deposition, evaporation, sputtering, and printing. Additive processes may sometimes be used to form substrates having holes therein.

Mechanical processes may be used to form posts and or holes in a substrate. For example, posts may be formed by stamping a blank. In addition, holes may be cut through substrates using a punch or another cutting device. Mechanical processes may also be used to isolate a selected post of attached to a substrate electrically from the other posts attached to the same post, e.g., by cutting the substrate into discontiguous sections.

As alluded to above, the method may involve the placement of a dielectric material between a post and a substrate, between substrates, and/or between posts. In some instances, a preformed dielectric material may be placed in an appropriate location, e.g., between substrates, as a substantially solid film. However, in situ dielectric materials formation techniques may be advantageously used as well. For example, a curable liquid may be injected between the substrates and subjected curing conditions to form a polymer layer between substrates. In addition, a ceramic layer may be formed between metallic posts by oxidizing one or more post surfaces between the posts.

In any case, the dielectric material may be subjected to bonding conditions, thereby forming a laminate connection structure. For example, pressure may be applied to a polymeric material between substrates to bond facing substrate surfaces. As another example, solvent may be removed from an adhesive solution by subjecting the solution to heat and/or vacuum.

Figure 3A:
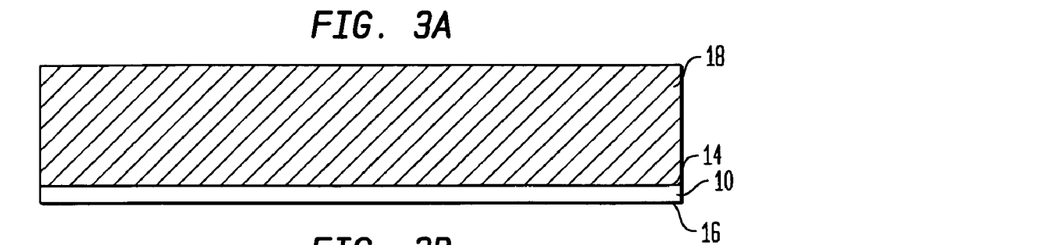
FIGS. 3A-3E, collectively referred to as FIG. 3, illustrate an exemplary method for making a connection structure.
Figure 3B:
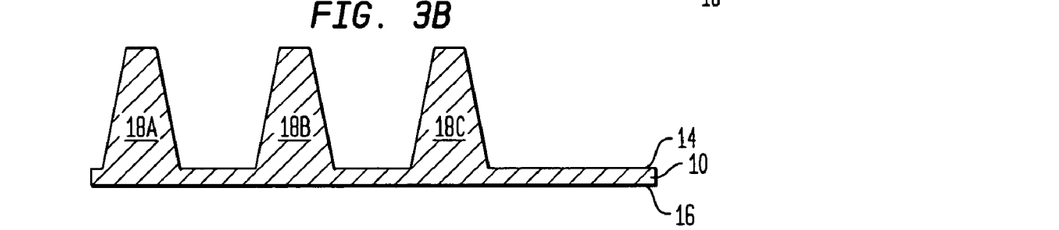
Figure 3C:
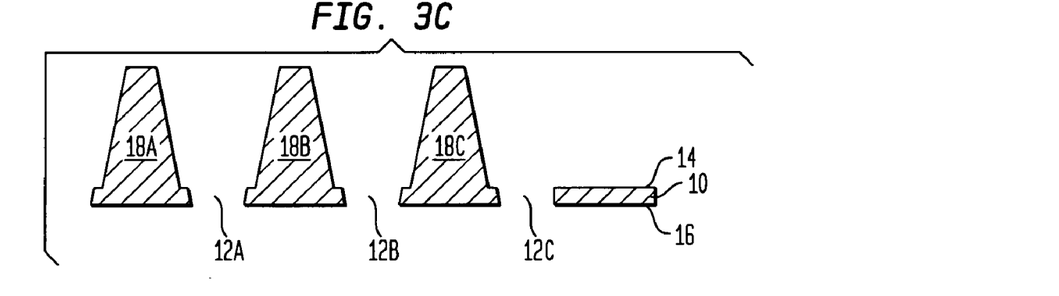

FIGS. 3A-3E, collectively referred to as FIG. 3, illustrate an exemplary method for making a connection structure. FIG. 3A shows a laminate formed from substrate 10 having opposing surfaces 14, 16 and a conductive sheet 18 coupled to substrate surface 14. Portions of the conductive sheet 18 are selectively removed by any suitable means to create a plurality of subtractively created, substantially rigid posts 18A-18C, as shown in FIG. 3B. For example, portions of the conductive sheet 18 may be are removed by first providing a masking portions 19M of the surface 19 of the conductive sheet 18 and etching away the conductive sheet 18 around the mask portions. Portions of the sheet 18 under the portions 19M are substantially unaltered to form posts 18A-18C. As shown in FIG. 3C, vias or holes 12A-12C may then be formed between the posts 18A-18C. As a result, a first layer is formed comprising substrate 10 having holes 12A-12C extending therethrough and posts 18A-18C extending from surface 14.

Figure 3D:
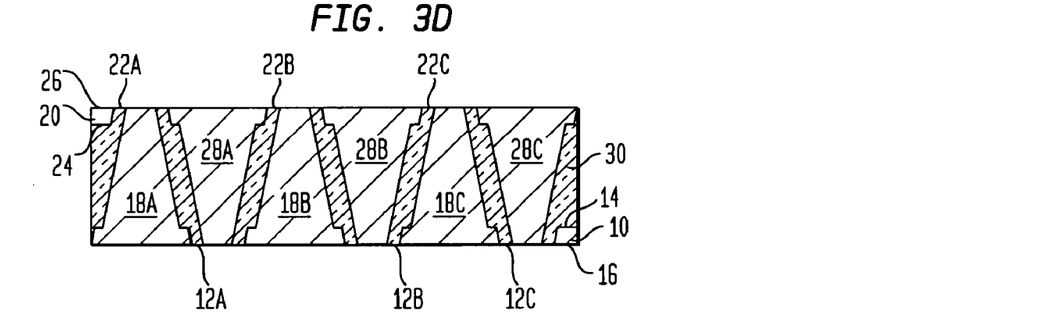
Figure 3E:
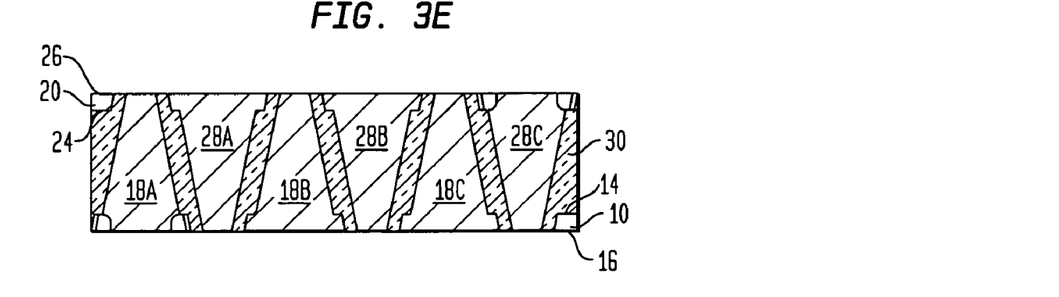

In FIG. 3D, a second layer identical in construction to the first layer is provided. The second layer is comprised of substrate 20 having holes 22A-22C extending through opposing surfaces 24, 26 and posts 28A-28C extending from surface 24. The layers are laminated together using dielectric material 30 such that surfaces 14 and 24 face each other. In addition, posts 18A-18C and 28A-28C are interdigitatingly positioned relative to each other. This arrangement prevents the tips of the posts from being crushed. Optionally, posts are isolated from others in the same layer by severing the portions of the substrate to which they are attached. As depicted in FIG. 3E, post 18A is electrically disconnected from posts 18B, 18C and post 28C, is electrically disconnected from posts 28A, 28B.

Figure 4A:
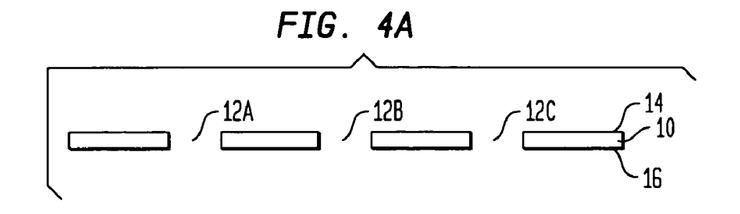
FIGS. 4A-4E, collectively referred to as FIG. 4, illustrate an alternative method for making the connection structures depicted in FIGS. 3D and 3E.
Figure 4B:
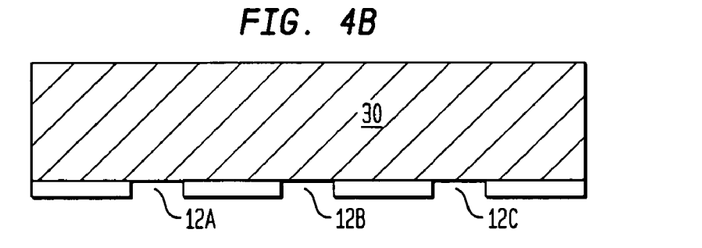
Figure 4C:
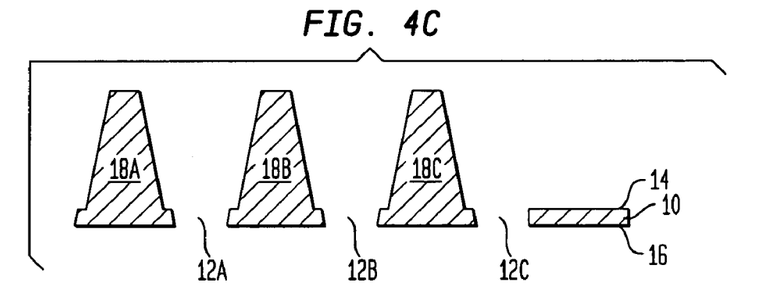
Figure 4D:
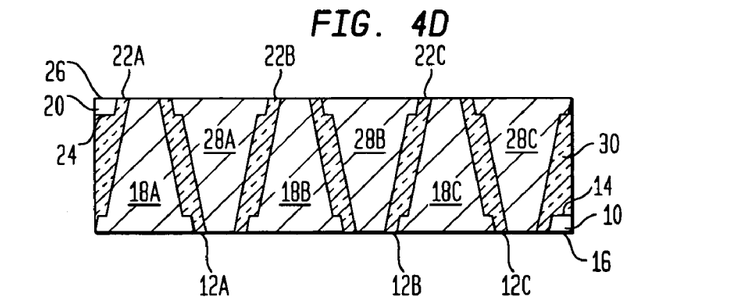
Figure 4E:
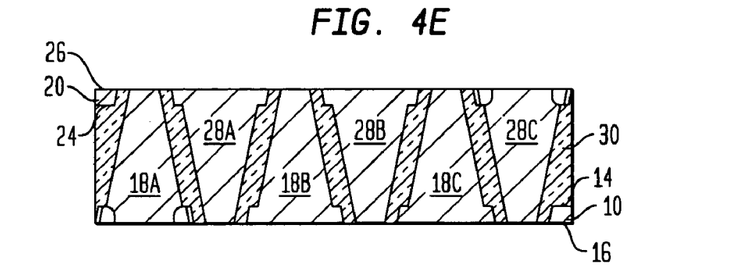

FIGS. 4A-4E, collectively referred to as FIG. 4, illustrate an alternative method for making the connection structure depicted in FIG. 3. FIG. 4A shows a substrate 10 having opposing parallel surfaces 14, 16 and vias or holes 12A-12C formed through the surfaces. FIG. 4B shows a laminate formed from the substrate 10 having a conductive sheet 18 coupled to surface 14. Then, as depicted in FIG. 4C, portions of the conductive sheet 18 overlying the remaining formations of substrate 10 are selectively removed by any suitable means to create a plurality of subtractively created, substantially rigid posts 18A-18C. As a result, a first layer is formed comprised of substrate 10 having holes 12A-12C extending therethrough and posts 18A-18C extending from surface 14. Similar to FIGS. 3D and 3E, FIGS. 4D and 4E depict the lamination of a second layer to the first layer, and the isolation of selected posts from others of the same layer.

Thus, it should be apparent that various steps involved in the practice of the inventive method may be carried out in different sequences.

Figure 5A:
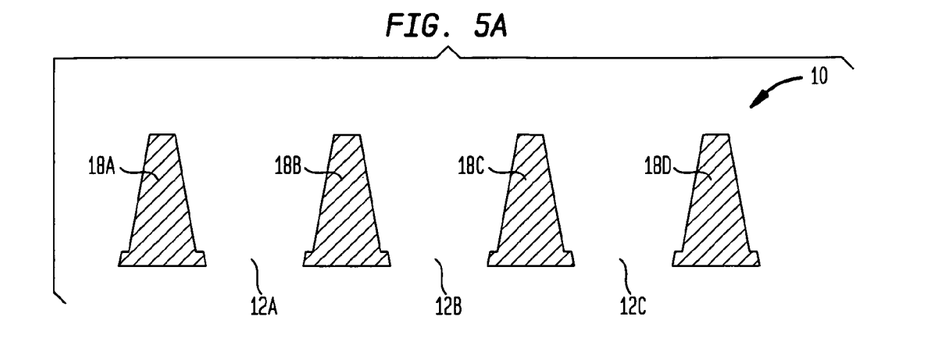
FIGS. 5A-5C, collectively referred to as FIG. 5, illustrate a method for making a connection structure having a plurality of posts, each post having an exterior dielectric layer.
Figure 5B:
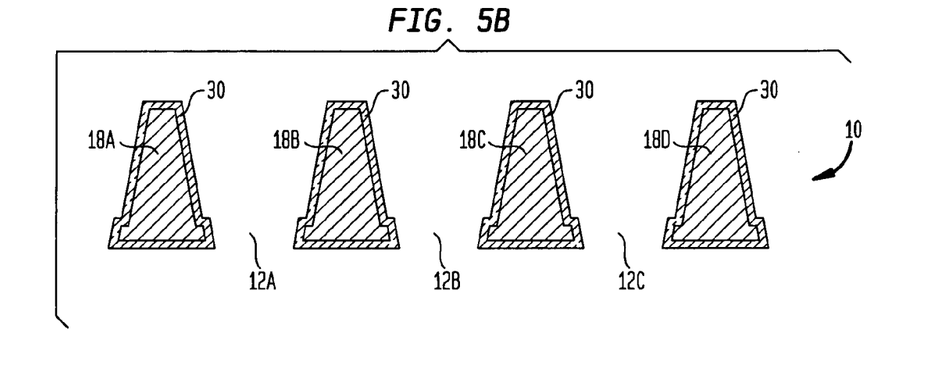
Figure 5C:
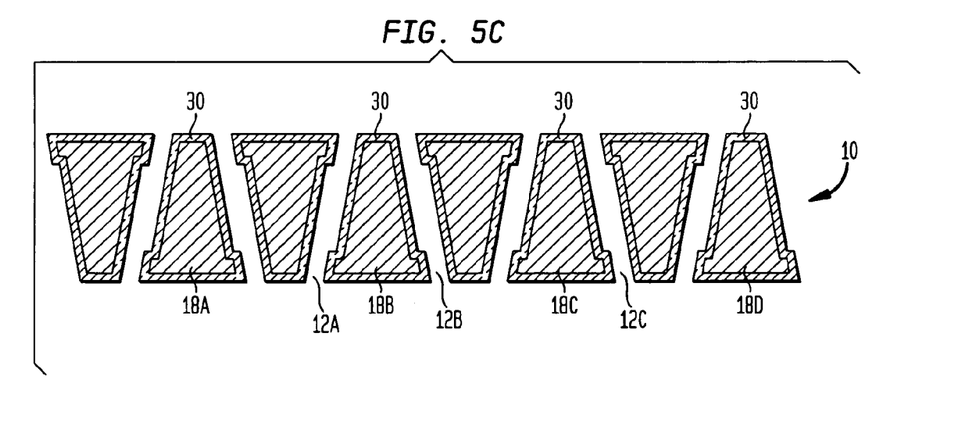
Figure 6A:
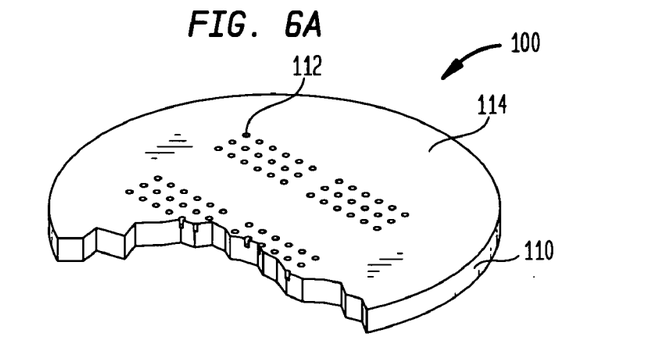
FIGS. 6A-6D, collectively referred to as FIG. 6, illustrate a method for forming an array of posts on a substrate surface.
Figure 6B:
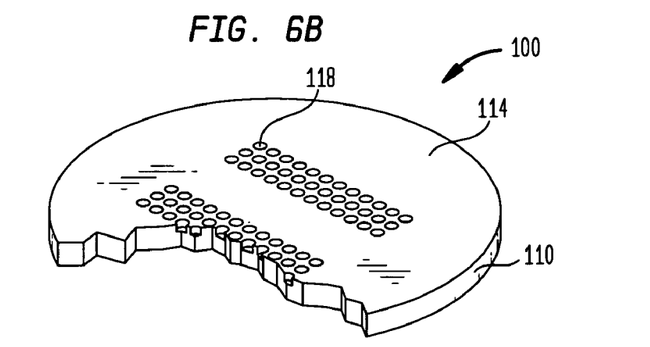
Figure 6C:
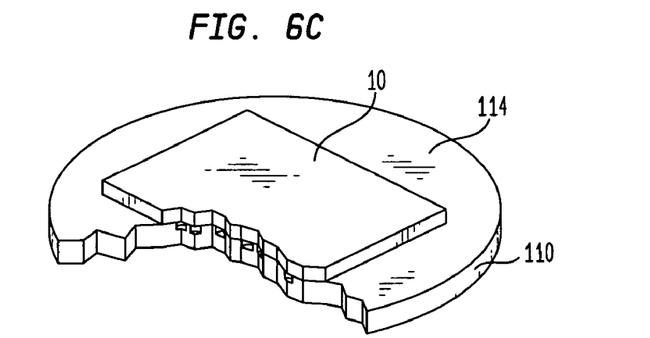
Figure 6D:
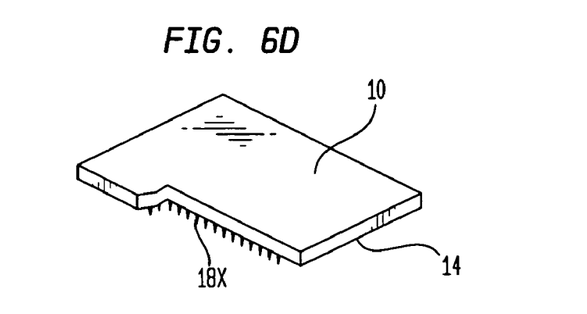

FIGS. 5A-5C, collectively referred to as FIG. 5, illustrate a method for making a connection structure having a plurality of posts, each post having an in situ formed exterior dielectric layer. As depicted in FIG. 5A, the method involves providing a layer similar to those depicted in FIGS. 3C and 4C comprised of substrate 10 having a plurality of holes 12A-12C and post 18A-18D, except that the layer is comprised of a metal suitable for anodization such as aluminum or titanium. Then, as depicted in FIG. 5B, anodization is carried out to form. As a result, each post 18A-18D has a dielectric layer 30 formed on its surface. Then, a second layer may be laminated together with the layer depicted in FIG. 5A to form the inventive structure 1. As a result, a plurality of dielectric material may be interposed between the substrates 10, 20. Optionally, as depicted in FIG. 5C, the layers have an identical construction.

FIG. 6 depicts an exemplary additive processing for forming posts of a uniform height, size and spacing on a substrate surface. In FIG. 6A, a mold 100 is provided comprising a wafer-shaped mandrel 110 and a plurality of intrusions 112 etched on a surface 114 thereof. In FIG. 6B, a filler material 118 is stencil printed to fill the intrusions 112 to a sufficient degree so as to provide some excess material on surface 114. Then, as depicted in FIG. 6C, substrate 10 is placed on surface 114. The filler material 118 is subjected to conditions effective for conversion into solid posts and for attachment to substrate 10. The substrate 10 is then removed from contact with mold 100. As a result, a substrate 10 having a plurality of posts 18X extending from surface 14 is formed.

The mold material should be compatible with the filler material and be able to withstand the conditions associated with the conversion of the filler material into solid posts. Since filler materials may reflow during their conversion into solid posts, the mold should be of a material selected to ensure that factors effecting surface energies such as surface tension and wetting forces are balanced so as to avoid adversely affecting the shape and/or the size of the posts formed therein. In any case, the mold material may be rigid or flexible. Examples of rigid mold materials include silicon, silicon oxide, and aluminum oxide. Exemplary flexible mold materials include polytetrafluoroethylene and polyimide.

The filler material may be comprised of any precursor composition that can be converted into a suitable material for forming the posts. For example, formulations containing metal particles in the form of a paste or paint may be used as a filler material. Such formulations are available from a number of different suppliers, including Ormet Circuits, Inc. (San Diego, Calif.). In particular, transient liquid phase system formulations generally used in printed circuit applications are known for their strong adhesion to copper, tin alloys, and other substrate materials.

Variations of the present invention will be apparent to those of ordinary skill in the art. For example, photoresist technologies known in the art may be used to provide selective masking when additive or subtractive processes are used to form the layers of the inventive connection structure. In addition, the inventive connection structure and the components thereof may be formed using either batch or continuous processes. The inventive connection structure may serve as a dimensionally stable and/or rigid electronic packaging core upon which additional layers may be placed. Furthermore, the posts described herein could be used for many other purposes besides connecting microelectronic devices to substrates without departing from the spirit of the present invention.

As these and other variations and combinations of the features discussed herein can be utilized without departing from the present invention as defined by the claims, the foregoing description of the preferred embodiments should be taken by way of illustration rather than by way of limitation of the invention as defined by the claims.

All patents mentioned herein are hereby incorporated by reference in their entireties.

The invention claimed is:

1. A connection structure for a microelectronic device, comprising:
    first and second substrates, each substrate having a first surface, a second surface opposing the first surface, and a plurality of holes extending through the first and second surfaces, wherein the substrates are arranged such that the first surfaces face each other;
    a plurality of first posts, each first post being electrically conductive and extending from a base at the first surface of the first substrate toward a tip in a corresponding hole of the second substrate; and
    a plurality of second posts, each second post being electrically conductive and extending from a base at the first surface of the second substrate toward a tip in a corresponding hole of the first substrate.

2. The structure of claim 1, wherein the second surfaces are substantially parallel to each other.

3. The structure of claim 1, wherein the second surface of the first substrate is substantially planar.

4. The structure of claim 1, wherein at least some of the first posts are arranged in an array.

5. The structure of claim 1, wherein at least two of the first posts have the same shape.

6. The structure of claim 1, wherein at least one of the first posts and at least one of the second posts have the same shape.

7. The structure of claim 1, wherein at least one of the first posts is axially symmetric.

8. The structure of claim 1, wherein at least one of the first posts has a tapered profile such that the tip thereof has a smaller cross-sectional area than the base thereof.

9. The structure of claim 1, wherein at least one of the first posts has a substantially conical shape.

10. The structure of claim 1, wherein at least one of the first posts has a substantially tetrahedral shape.

11. The structure of claim 1, wherein neighboring first and second posts have walls that are substantially parallel to each other but are not perpendicular to the second surface of at least the one of the substrates.

12. The structure of claim 1, wherein neighboring first and second posts are arranged such that a line that is substantially perpendicular to the second surface of at least one of the substrates intersects a portion of each neighboring post.

13. The structure of claim 1, wherein at least one of the first posts has a narrow region between tip and base thereof, and the narrow region has a smaller cross-sectional area than either the tip or the base of the at least one of the first post.

14. The structure of claim 1, wherein at least two first posts are electrically connected to each other via the first substrate.

15. The structure of claim 1, wherein at least two first posts are electrically isolated from each other.

16. The structure of claim 1, wherein at least one of the first and second substrates is contiguous.

17. The structure of claim 1, wherein at least one of the first and second substrates is discontiguous.

18. The structure of claim 1, wherein at least a portion the first substrate is electrically isolated from at least a portion of the second substrate.

19. The structure of claim 1, wherein at least one of the first and second substrates is comprised of a metal.

20. The structure of claim 1, wherein at least one of the first and second substrates is comprised of a dielectric material.

21. The structure of claim 1, wherein at least one of the first and second posts is comprised of a metal.

22. The structure of claim 1, wherein the first substrate and at least one of the first posts is comprised of the same electrically conductive material.

23. The structure of claim 1, further comprising a dielectric material between the substrates.

24. The structure of claim 1, wherein the posts are present in a density greater than about 100 posts per square centimeter.

25. The structure of claim 3, wherein at least one of the first posts has a surface at the tip thereof that is substantially coplanar to the second surface of the second substrate.

26. The structure of claim 4, wherein the array is a rectilinear array.

27. The structure of claim 4, wherein a post of the array has at least four equidistance neighboring posts.

28. The structure of claim 4, wherein at least some of the second posts are arranged in array.

29. The structure of claim 23, wherein the dielectric material is comprised of a polymeric material.

30. The structure of claim 25, wherein at least one of the second posts has a surface at the tip thereof that is substantially coplanar to the second surface of the first substrate.

31. The structure of claim 25, wherein the first posts have substantially coplanar surfaces at the tips thereof.

32. The structure of claim 28, wherein the array of first posts and the array of the second posts have the same number of posts per unit area.

33. The structure of claim 29, wherein the dielectric material is comprised of a ceramic material.

34. A method for forming a connection structure for a microelectronic device, comprising:
 (a) providing first and second layers, wherein each layer is comprised of
  a substrate having a first surface, a second surface opposing the first surface, and a plurality of holes extending through the first and second surfaces, and
  a plurality of electrically conductive posts, each post extending from a base at the first surface toward a tip; and
 (b) positioning the layers relative to each other such that the first surfaces face each other,
  each tip of the posts of the first layer is located in a corresponding hole of the second substrate
  each tip of the posts of the second layer is located in a corresponding hole of the first substrate.

35. The method of claim 34, wherein step (a) comprises forming the posts for at least one layer by a subtractive process.

36. The method of claim 34, wherein step (a) comprises forming the posts for at least one layer by an additive process.

37. The method of claim 34, wherein step (a) comprises forming the posts for at least one layer by a mechanical process.

38. The method of claim 34, wherein step (a) comprises etching the substrate of at least one layer to form the holes therein.

39. The method of claim 34, wherein step (a) comprises cutting the substrate of at least one layer to form holes therein.

40. The method of claim 34, wherein step (b) comprises placing a dielectric material between the substrates.

41. The method of claim 34, further comprising (c) electrically isolating a selected post of at least one layer from the other posts of the same layer.

42. The method of claim 35, wherein the posts for the at least one layer is formed by selectively removing material from an electrically conductive sheet on the first surface of the substrate of the at least one layer.

43. The method of claim 37, wherein step (a) comprises stamping a sheet of electrically conductive material.

44. The method of claim 38, wherein step (a) comprises using the same etchant to form both the holes and the posts of at least one layer.

45. The method of claim 39, wherein the substrate is cut using a punch.

46. The method of claim 40, wherein the dielectric material is a polymeric material.

47. The method of claim 41, wherein step (c) comprises cutting the substrate into discontiguous sections.

48. The method of claim 42, wherein material is selectively removed by etching the conductive layer.

49. The method of claim 42, wherein step (a) comprises selectively removing material from a unitary sheet of electrically conductive material, thereby forming the posts for at least one layer as an integral part of the substrate for the at least one layer.

50. The method of claim 46, wherein step (b) further comprises subjecting the polymeric material to conditions effective to bond the substrates, thereby forming a laminate structure.

51. The method of claim 50, wherein step (b) further comprises heating the polymeric material.

* * * * *

UNITED STATES PATENT AND TRADEMARK OFFICE
CERTIFICATE OF CORRECTION

PATENT NO. : 7,262,368 B2  Page 1 of 1
APPLICATION NO. : 10/917978
DATED : August 28, 2007
INVENTOR(S) : Belgacem Haba et al.

It is certified that error appears in the above-identified patent and that said Letters Patent is hereby corrected as shown below:

Column 1, line 35, "a microelectronic" should read -- microelectronic --.
Column 1, line 55, "decrease," should read -- decreases, --.
Column 2, line 10, "and is" should read -- and --.
Column 2, line 36, "exists" should read -- exist --.
Column 3, line 38, "as single" should read -- as a single --.
Column 3, line 56, "in an" should read -- an --.
Column 4, line 3, "each and" should read -- each other and --.
Column 4, line 6, "other was" should read -- other as --.
Column 4, line 19, "exhibit of" should read -- exhibits --.
Column 5, line 1, "oxide such" should read -- oxide --.
Column 6, line 18, "tower shaped" should read -- tower-shaped --.
Column 6, line 24, "from it" should read -- from its --.
Column 6, line 48, "involve" should read -- involving --.
Column 7, line 65, "by may" should read -- may --.
Column 8, line 15, "post of" should read -- post --.
Column 8, line 30, "post of" should read -- post --.
Column 8, line 61, "are removed" should read -- removed --.
Column 9, line 16, "28C, is" should read -- 28C is --.
Column 11, line 26, "first post" should read -- first posts --.
Column 11, line 36, "portion the" should read -- portion of the --.
Column 11, line 47, "posts is" should read -- posts are --.
Column 11, line 62, "in array" should read -- in an array --.
Column 12, line 46, "layer is" should read -- layer are --.

Signed and Sealed this

Fifth Day of August, 2008

JON W. DUDAS
*Director of the United States Patent and Trademark Office*